(12) United States Patent
Yamagishi

(10) Patent No.: US 6,309,963 B1
(45) Date of Patent: Oct. 30, 2001

(54) METHOD FOR MANUFACTURING SEMICONDUCTOR DEVICE

(75) Inventor: Hajime Yamagishi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/497,150

(22) Filed: Feb. 3, 2000

(30) Foreign Application Priority Data

Feb. 5, 1999 (JP) ................................................. 11-028066

(51) Int. Cl.[7] ................................................. H01L 21/4763
(52) U.S. Cl. .......................... 438/642; 438/627; 438/637; 438/656; 438/671; 438/702; 438/970
(58) Field of Search ...................................... 438/642, 636, 438/648, 656, 671, 685, 627, 637, 643, 672, 702, 653, 970

(56) References Cited

U.S. PATENT DOCUMENTS 5,231,053 * 7/1993 Bost et al. ............................ 438/627
5,646,449 * 7/1997 Nakamura et al. .................. 257/761
5,961,791 * 10/1999 Frisa et al. ............................ 438/648

FOREIGN PATENT DOCUMENTS

407263444A * 10/1995 (JP) ............................ H01L/21/3205

* cited by examiner

*Primary Examiner*—Matthew Smith
*Assistant Examiner*—Igwe U. Anya
(74) *Attorney, Agent, or Firm*—Ronald P. Kananen; Rader, Fishman & Grauer

(57) ABSTRACT

In a method of manufacturing a semiconductor device wherein the step of forming a titanium film and a titanium nitride film on an aluminum-based alloy film overlying a substrate is carried out for a plurality of such substrates in succession; the titanium film and the titanium nitride film are formed within an identical chamber by changing a processing gas, and under the condition that, in case of forming the titanium film by sputtering, a titanium target having been employed for the formation of the titanium nitride film is used. Thus, the formation of an aluminum-titanium alloy layer attributed to a heat treatment at or above 400° C. can be suppressed to enhance an electromigration immunity.

5 Claims, 3 Drawing Sheets

METHOD FOR MANUFACTURING SEMICONDUCTOR DEVICE

BACKGROUND OF THE INVENTION

1. Field of the Invention

The present invention relates to a method of manufacturing a semiconductor device. More particularly, it relates to a method of manufacturing a semiconductor device wherein a titanium film and a titanium nitride film overlying the titanium film are formed.

2. Description of the Related Art

As also seen in very large scale integration (VLSI), ultra LSI (ULSI), or the like, a proportion occupied by wiring portions tends to increase on a semiconductor device or chip as the device is heightened in the density of integration and is enhanced in functionality. A wiring pitch has been shortened in order to prevent the area of the chip from enlarging due to the increase of the occupied proportion.

In applying a borderless VIA hole to the shortened wiring pitch, there has been adopted a structure wherein a titanium nitride film formed over a lower-layer wiring line and to constitute a cap metal is left in the bottom of the VIA hole at the step of etching the VIA hole. In this case, a wiring line structure wherein a titanium film 112 is sandwiched in between an aluminum-copper alloy film 111 being the material of the lower-layer wiring line and the above titanium nitride film 113 as shown in FIG. 3 of the accompanying drawings, has been usually adopted in order to lower a VIA resistance.

A related art method of forming the titanium film and the titanium nitride film will be explained below. As illustrated in FIG. 4, titanium film and the titanium nitride film to constitute the cap metal are formed by employing a sputtering apparatus in which a chamber 201 for the titanium film and a chamber 202 for the titanium nitride film are disposed separately from each other, and in such a way that, after the titanium film has been formed in the chamber 201, the titanium nitride film is formed in the chamber 202. Alternatively, using a single chamber, not shown, which is furnished with a shutter for cleaning a target surface, only the target surface is cleaned by closing the shutter before the formation of the titanium film, and the titanium film and the titanium nitride film are thereafter formed by sputtering.

The titanium film obtained by the film forming method stated above has a thickness of 5 [nm]~10 [nm] or so ordinarily, and it is a film of good quality containing nitrogen and the like impurities little.

The wiring line structure obtained by the related art film forming method, however, has a problem as stated below. An aluminum-titanium alloy layer 114 which is produced by the reaction of aluminum and titanium is formed on the aluminum-copper alloy film 111 as shown in FIG. 5, due to a heat treatment at 400° C. or above. The aluminum-titanium alloy layer 114 has been reported to act as the diffusing path of atoms. It forms a cause for the drift of aluminum atoms, and deteriorates an electromigration lifetime.

SUMMARY OF THE INVENTION

The present invention has been made in order to solve the problem explained above, and it consists in a method of manufacturing a semiconductor device wherein the step of forming a titanium film and a titanium nitride film on an aluminum-based alloy film overlying a substrate is carried out for a plurality of such substrates in succession, characterized by comprising the step of forming the titanium film and the titanium nitride film within an identical chamber by changing a processing gas, and under a condition that, in forming said titanium film by sputtering, a titanium target having been employed for the formation of said titanium nitride film is used.

According to the above method of manufacturing a semiconductor device, the titanium film and the titanium nitride film are formed within the identical chamber by changing the processing gas, and under the condition that, in the case of forming the titanium film by sputtering, the titanium target having been employed for the formation of the titanium nitride film is used. Therefore, the surface of the target for forming the titanium film bears titanium nitride produced. At the initial stage of the formation of the titanium film, accordingly, the titanium nitride borne on the target surface is deposited together with titanium, and the titanium film is formed in a state where nitrogen is contained. That is, a so-called "titanium film of charged quality" is formed. It is consequently possible to suppress the reaction between the titanium film and aluminum contained in the aluminum-based alloy film underlying this titanium film. That is, the production of an aluminum-titanium alloy can be suppressed to greatly enhance an electromigration immunity.

PREFERRED EMBODIMENTS OF THE INVENTION

A method of manufacturing a semiconductor device in the first embodiment of the present invention will be described with reference to FIG. 1 of the accompanying drawings.

Figure 1:
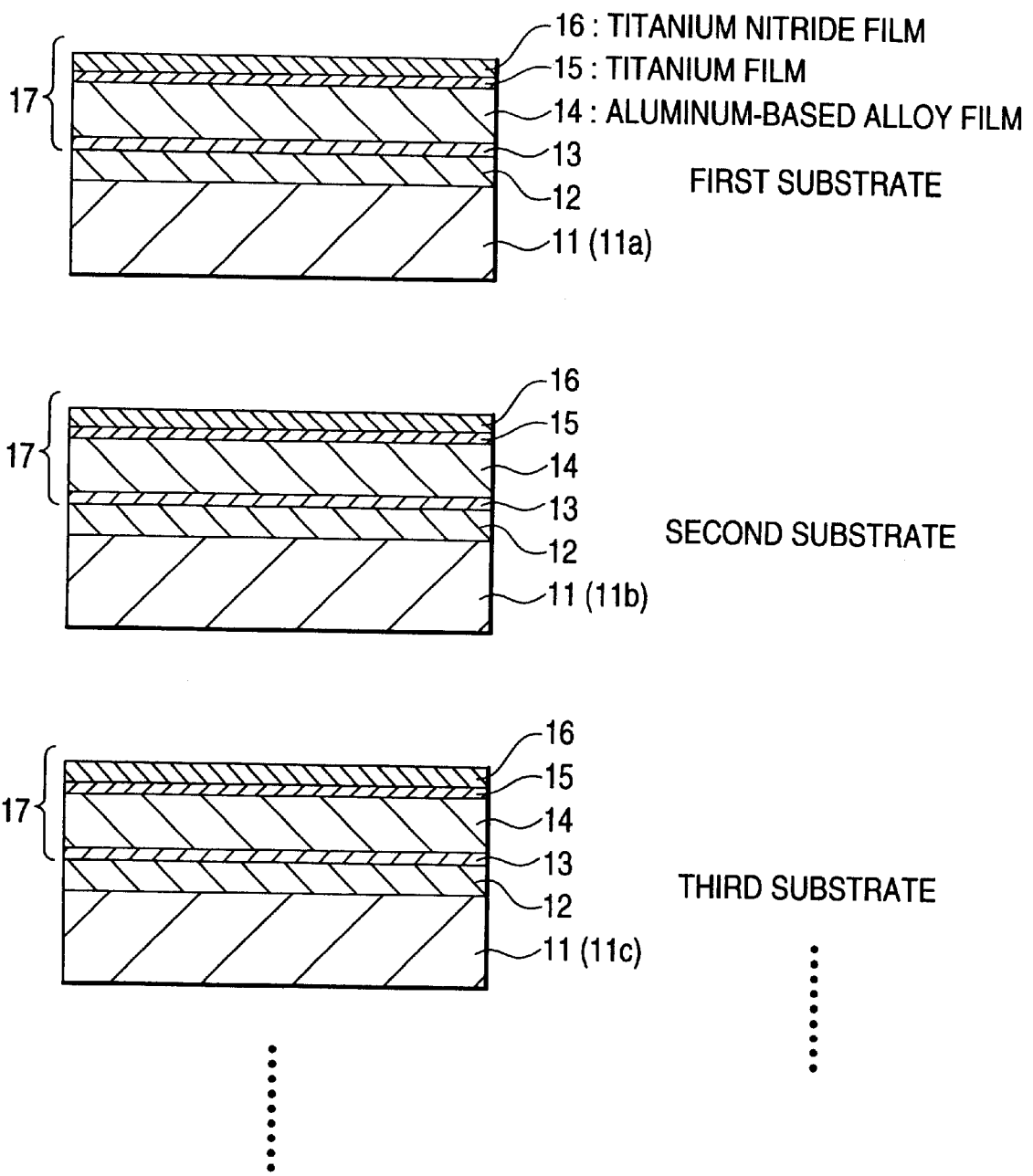
FIG. 1 is an explanatory sectional view showing a method of manufacturing a semiconductor device in the first embodiment of the present invention.

As illustrated in FIG. 1, a plurality of substrates 11 (11a, 11b, 11c, . . . ) are successively subjected to processing steps as explained below.

First, insulating films 12 made of, for example, silicon oxide are formed on the respective substrates 11a, 11b, 11c, . . . in succession. Subsequently, a subbing metal film 13 made of, for example, titanium is formed on each of the insulating films 12 to a thickness of, for example, 20 [nm] by employing, for example, a magnetron sputtering apparatus. By way of example, conditions for forming the subbing metal film 13 are that argon (flow rate: 82 [sccm]) is used as a processing gas, and that the pressure of a film forming atmosphere, the level of RF (radio frequency) power and the temperature of each substrate are respectively set at 0.4 [Pa], 2 [kW] and 200° C.

Besides, an aluminum-based alloy film 14 made of, for example, Al-0.5% Cu is formed on each of the subbing metal films 13 to a thickness of, for example, 0.5 [μm]. By way of example, conditions for forming the aluminum-based alloy film 14 are that a magnetron sputtering apparatus is employed, that argon (flow rate: 65 [sccm]) is used as a processing gas, and that the pressure of a film forming atmosphere, the level of RF power and the temperature of each substrate are respectively set at 0.27 [Pa], 15 [kW] and 300° C.

Subsequently, a titanium film 15 and a titanium nitride film 16 to constitute a cap metal film are formed on each of the aluminum-based alloy films 14 by employing, for example, a magnetron sputtering apparatus and by changing a processing gas within the identical chamber of the magnetron sputtering apparatus.

More specifically, the titanium film 15 is first formed to a thickness of, for example, 5 [nm] by employing a titanium target as a sputtering target and employing argon as the processing gas. Subsequently, the titanium nitride film 16 is formed to a thickness of, for example, 100 [nm] by employing the above titanium target and employing argon and nitrogen as the processing gas.

Besides, in case of forming the titanium film 15 over the second substrate 11b, the titanium target having been employed for forming the titanium nitride film 16 over the first substrate 11a is used without being cleaned. Further, in case of forming the titanium film 15 over the third substrate 11c, the titanium target having been employed for forming the titanium nitride film 16 over the second substrate 11b is used without being cleaned. Also, the formation of the titanium film 15 over each of the fourth substrate 11, et seq., may be implemented by the same process as in the formation of the titanium film 15 over the second substrate 11b or the third substrate 11c. By the way, in case of forming the titanium film 15 over the first substrate 11a, a titanium nitride film is formed over a dummy substrate before the formation of the titanium film 15 over the first substrate 11a, and the titanium target having been employed on that occasion is used without being cleaned.

By way of example, conditions for forming the titanium film 15 are that argon (flow rate: 82 [sccm]) is used as the processing gas, and that the pressure of a film forming atmosphere, the level of RF power and the temperature of each substrate are respectively set at 0.4 [Pa], 1 [kW] and 200° C.

On the other hand, examples of conditions for forming the titanium nitride film 16 are that argon (flow rate: 33 [sccm]) and nitrogen (flow rate: 66 [sccm]) are used as the processing gas, and that the pressure of a film forming atmosphere, the level of RF power and the temperature of each substrate are respectively set at 0.33 [Pa], 8 [kW] and 200°0 C.

Thus, a wiring layer 17 made up of the subbing metal film 13~the titanium nitride film 16 is formed.

In this manner, in the case where the plurality of substrates 11 are prepared, the subbing metal films 13, aluminum-based alloy films 14, titanium films 15 and titanium nitride films 16 are successively formed on the individual substrates 11 (11a, 11b, 11c, . . . ) by the process as described above.

Figure 5:
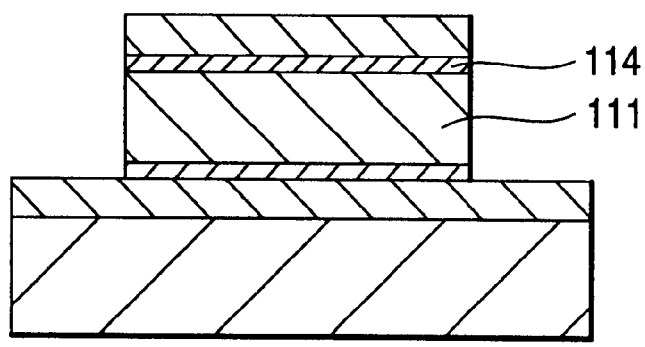
FIG. 5 is a sectional view for explaining a problem in the related art.

According to the above method of manufacturing a semiconductor device, the titanium film 15 and the titanium nitride film 16 are formed within the identical chamber by changing the processing gas, and under the condition that, in the case of forming the titanium film 15 by sputtering, the titanium target having been employed for the formation of the titanium nitride film 16 is used. Therefore, the surface of the target for forming the titanium film 15 bears titanium nitride produced. At the initial stage of the formation of the titanium film 15, accordingly, the titanium nitride borne on the target surface is deposited together with titanium, and the titanium film 15 is formed in a state where nitrogen is contained. That is, a so-called "titanium film of charged quality" is formed. It is consequently possible to suppress the drawback that the titanium film 15 and aluminum contained in the aluminum-based alloy film 14 underlying this titanium film 15 react due to a heat treatment at 400° C. or above. Even when an aluminum-titanium alloy has been produced by the above reaction, it is formed to be thin and in the shape of islands without being formed in the shape of the layer (114 in FIG. 5) as in the related art. In this manner, the production of the aluminum-titanium alloy is suppressed by the manufacturing method of the present invention.

Figure 2A:
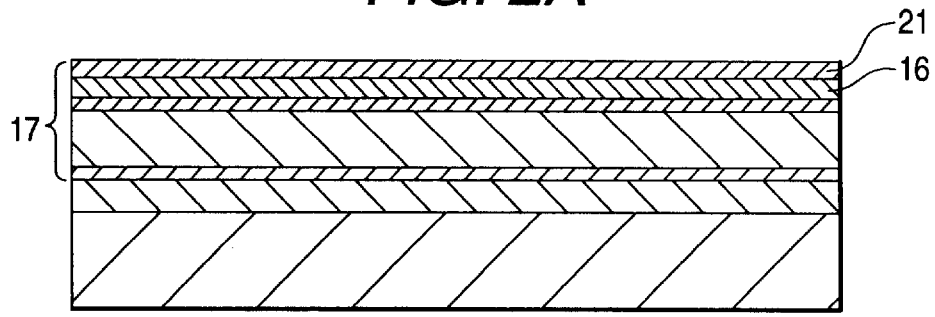
FIGS. 2A and 2B are sectional views for explaining a method of forming wiring lines.

Thereafter, as illustrated in FIG. 2A, an oxidized nitride film 21 is formed on the titanium nitride film 16. The oxidized nitride film 21 is formed by employing, for example, a parallel-plate electrode type plasma CVD (chemical vapor deposition) apparatus, and by depositing oxidized silicon nitride to a thickness of, for example, 50 [nm]. By way of example, conditions for forming the oxidized nitride film 21 are that monosilane [$SiH_4$] (flow rate: 158 [sccm]) and dinitrogen monoxide [$N_2O$] (flow rate: 230 [sccm]) are used as a processing gas, and that the pressure of a film forming atmosphere, the level of RF power and the temperature of each substrate are respectively set at 330 [Pa], 190 [W] and 400° C.

Incidentally, the oxidized nitride film 21 serves as an inorganic mask material for anisotropic ion etching in case of working the wiring layer 17, and it is also effective to prevent reflection in case of photoresist patterning.

At the next step, the oxidized nitride film 21 is patterned by photoresist patterning and anisotropic ion etching techniques. By way of example, conditions for etching the oxidized nitride film 21 are that trifluoromethane [$CHF_3$] (flow rate: 30 [sccm]), tetrafluoromethane [$CF_4$] (flow rate: 60 [sccm]) and argon (flow rate: 800 [sccm]) are used as an etching gas, and that the pressure of an etching atmosphere and the temperature of each substrate are respectively set at 200 [Pa] and 25° C.

Figure 2B:
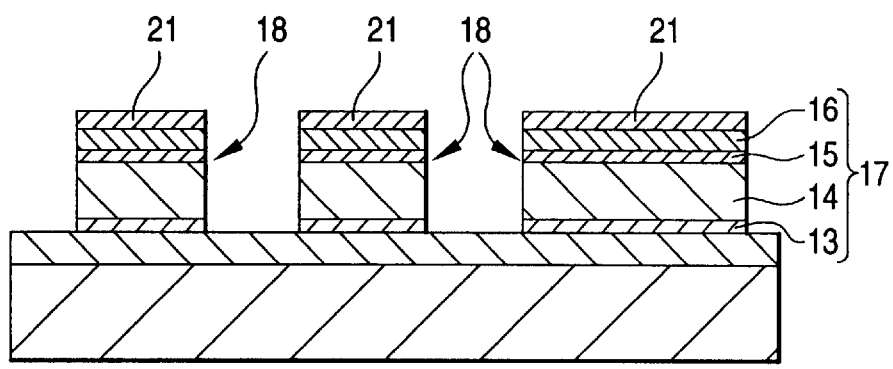

Subsequently, as illustrated in FIG. 2B, the anisotropic ion etching is carried out using the resulting oxidized nitride film 21 as a mask, so as to pattern the titanium nitride film 16, titanium film 15, aluminum-based alloy film 14 and subbing metal film 13 and to form wiring lines 18. By way of example, conditions for etching the wiring layer 17 are that boron trichloride [$BCl_3$] (flow rate: 100 [sccm]) and chlorine (flow rate: 100 [sccm]) are used as an etching gas, and that the pressure of an etching atmosphere and the temperature of each substrate are respectively set at 1 [kPa] and 400° C.

Incidentally, the titanium nitride film 16 is effective to attain a low contact resistance and to prevent a close adhesion layer from peeling off in blanket tungsten CVD.

Now, there will be described a method of manufacturing a semiconductor device in the second embodiment of the present invention.

In the first embodiment, the titanium film 15 has been explained to be 5 [nm] thick. Regarding the thickness of a titanium film, the present invention can be executed even when the shortest time period capable of creating a plasma is set for sputtering in relation to the performance of a sputtering apparatus.

By way of example, conditions for forming the titanium film 15 in this case are that argon (flow rate: 82 [sccm]) is used as a processing gas, and that the pressure of a film forming atmosphere, the level of RF power and the temperature of each substrate are respectively set at 0.4 [Pa], 1 [kW] and 200° C.

On this occasion, the sputtering of titanium is implemented only for a moment like a flash. The other processing steps are the same as in the first embodiment.

Figure 3:
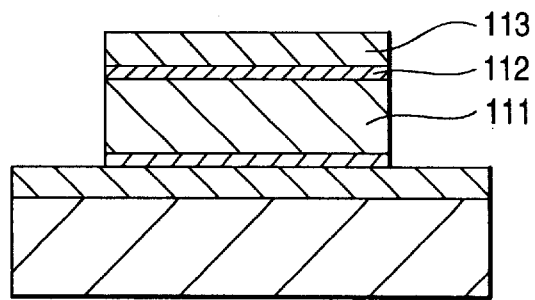
FIG. 3 is a sectional view for explaining a wiring line structure in the related art.
Figure 4:
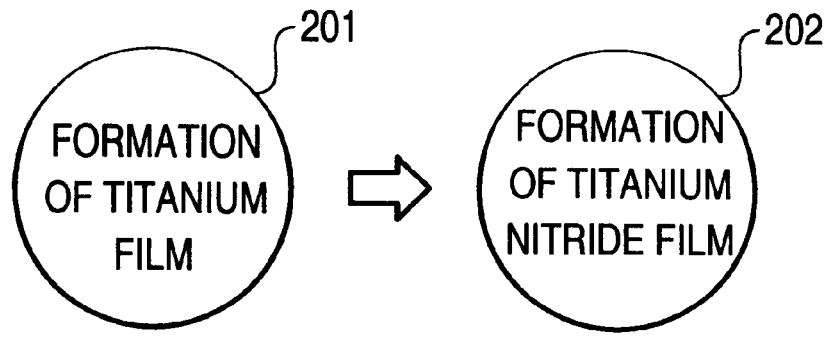
FIG. 4 is a schematic view for explaining a related art method of forming films by sputtering.

In the second embodiment, the titanium film 15 is formed by the flash-like momentary sputtering, and hence, it is very thin and has a thickness being less than 5 [nm] by way of example. In the case where the thickness of the titanium film 15 formed is below 5 [nm] in this manner, an electromigration immunity is enhanced much more than in the case of forming the titanium film (112 in FIG. 3) to a thickness of 5 [nm] or above as in the related art.

As described above, according to the method of the present invention for manufacturing a semiconductor device, a titanium film and a titanium nitride film are formed within the identical chamber of a sputtering apparatus by changing a processing gas, and under the condition that, in forming the titanium film by sputtering, a titanium target having been employed for the formation of the titanium nitride film is used. Therefore, the surface of the target for forming the titanium film bears titanium nitride produced. Accordingly, the titanium film is formed in a state where nitrogen is contained, so that the titanium film of charged quality is formed. It is consequently possible to suppress the reaction between the titanium film and aluminum contained in an aluminum-based alloy film underlying this titanium film, and to enhance an electromigration immunity. Moreover, since the chamber construction of the sputtering apparatus can be simplified, the productivity of the manufacture can be greatly enhanced.

What is claimed is:

1. In a method of manufacturing a semiconductor device wherein a step of forming a titanium film and a titanium nitride film on an aluminum-based alloy film overlying a substrate is carried out for a first and second of such substrates in succession, the improvement comprising;

forming the titanium film for said second substrate and the titanium nitride film for said first substrate within an identical chamber by changing a processing gas, and under a condition that, in forming said titanium film for said second substrate by sputtering, a titanium nitride bearing target for said second substrate having been employed for the formation of said titanium nitride film for said first substrate is used.

2. A method of manufacturing a semiconductor device as defined in claim 1, wherein said titanium film is formed to a thickness being less than 5 nm.

3. A method of manufacturing a semiconductor device as defined in claim 1, wherein said titanium target for said second substrate bears titanium nitride due to having been employed for the formation of said titanium nitride film for said first substrate.

4. In a method of manufacturing a semiconductor device wherein a step of forming a titanium film and a titanium nitride film on an aluminum-based alloy film overlying a substrate is carried out for a first and second of such substrates in succession, the improvement comprising;

forming the titanium film for said first substrate under a condition that a titanium target is used that bears titanium nitride.

5. A method of manufacturing a semiconductor device as defined in claim 4, wherein said titanium film is formed to a thickness being less than 5 nm.

* * * * *